United States Patent [19]
Ohsawa

[11] Patent Number: 5,473,174
[45] Date of Patent: Dec. 5, 1995

[54] III-V COMPOUND SEMICONDUCTOR DEVICE FORMED ON SILICON SUBSTRATE

[75] Inventor: Youichi Ohsawa, Tokyo, Japan

[73] Assignee: NEC Corporation, Tokyo, Japan

[21] Appl. No.: 348,823

[22] Filed: Nov. 28, 1994

[30] Foreign Application Priority Data

Nov. 26, 1993 [JP] Japan .................................. 5-296456

[51] Int. Cl.$^6$ ............................ H01L 29/06; H01L 29/15
[52] U.S. Cl. ............................ 257/190; 257/18; 257/200; 372/48
[58] Field of Search ........................... 257/190, 18, 200; 372/102, 48

[56] References Cited

U.S. PATENT DOCUMENTS

| | | | |
|---|---|---|---|
| 4,872,046 | 10/1989 | Morkoc et al. | 257/200 |
| 5,206,877 | 4/1993 | Kahen | 372/48 |
| 5,285,086 | 2/1994 | Fitzgerald | 257/190 |

FOREIGN PATENT DOCUMENTS 61-274312  12/1986  Japan .................................. 257/190

OTHER PUBLICATIONS

Lo et al, *Appl. Phys. Lett.* 52 (17), 25 Apr. 1988 pp. 1386–1388.
Lin et al, *Appl. Phys. Lett.* (51) (11) 14 Sep. 1987 pp. 814–816 "Growth in porous silicon".

*Primary Examiner*—Jerome Jackson
*Attorney, Agent, or Firm*—Young & Thompson

[57] ABSTRACT

A buffer layer of a III-V compound semiconductor device grown by depositing III-V compound semiconductor layers on a silicon semiconductor substrate 21 has minimum stress and no dislocation propagation. Periodic recesses are formed on a surface of the silicon semiconductor substrate 21 and a Ga layer 41 and an As layer 61 are formed on opposite side surfaces of each recess, respectively. A GaAs strain superlattice layer 22 thus formed is used as the buffer layer. Dislocation is confined to the buffer layer which can be made thin. Stress and consequent warpage are reduced by the recesses.

5 Claims, 2 Drawing Sheets

5,473,174

III-V COMPOUND SEMICONDUCTOR DEVICE FORMED ON SILICON SUBSTRATE

BACKGROUND OF THE INVENTION

1. Field of the Invention

The present invention relates to a III-V compound semiconductor device formed on a silicon monocrystalline semiconductor substrate (referred to as Si-substrate, hereinafter) and, in particular, an optical semiconductor device formed on the Si-substrate.

2. Description of Related Art

Growth technology for monocrystalline III-V compound semiconductor layers on a surface of the Si-substrate by using a molecular beam epitaxy (referred to as MBE, hereinafter) or a metal organic vapor phase epitaxy (referred to as MOVPE, hereinafter) is important, in view of cost and integration of two devices such as an optical semiconductor device and silicon integrated circuits on the same Si-substrate.

Referring to FIG. 1, a conventional semiconductor laser device formed on a Si-substrate has a first and second buffer layers 2 and 4 sandwiching a strain superlattice layer 3 of InP-In$_{1-x}$Ga$_x$As$_y$P$_{1-y}$(0<x<1, 0<y<1). The first buffer layer 2 comprises an n-type GaAs of 1–3 μm thickness. The second buffer layer 4 comprises an n-type InP of 10–20 μm thickness. On the second buffer layer 4, an n-type cladding layer 5 of In$_u$ Ga$_{1-u}$ As$_w$ P$_{1-w}$ (2.0 μm thick), a p-type active layer 6 of In$_{0.76}$ Ga$_{0.24}$ As$_{0.55}$ P$_{0.45}$, a p-type active layer 7 of In$_u$ Ga$_{1-u}$ As$_w$ P$_{1-w}$ (1.5 μm thick) and a n-type contact layer 8 of In$_t$ Ga$_{1-t}$ As$_u$ P$_{1-u}$ (1.0 μm thick) are grown in that order and a p+-type diffusion layer 10 is formed by diffusing zinc through an opening formed in a silicon oxide film 9 formed on the contact layer 8. Reference numerals 11 and 12 depict a p-side electrode and an n-side electrode, respectively.

When a GaAs layer is grown in a Si-substrate, defects appear owing to lattice mismatch or anti-phased domain. Silicon (Si) is a non-polar semiconductor having a covalent bond, while GaAs is a polar semiconductor having a partially ionic bond. The lattice constant of GaAs is larger than that of Si by 4%. Furthermore, the thermal expansion coefficient of GaAs is larger than that of Si.

If an initial layer on the Si-substrate is a mixed layer of gallium (Ga) or arsenic (As) atoms, the anti-phased domain is formed. The anti-phased domain is prevented by forming a single atom layer of either As or Ga before the GaAs growth is started. However, since the difference in lattice constant between Si and GaAs is large, dislocation of about $10^{12}$–$10^{13}$/cm$^2$ is concentrated on a flat interface.

Although the influence of edge type dislocation defined in this interface region on reliability of transistors and/or laser diode formed on the interface is not known sufficiently, growth of dislocation, that is, upward propagation thereof, causes leak current to be increased which leads to degradation of semiconductor device performance.

In order to avoid the adverse influence due to the upward propagation of dislocation, the first and second buffer layers 2 and 4 are made sufficiently thick as mentioned previously.

In the conventional semiconductor device mentioned above, stress is caused due to difference in thermal expansion coefficient between the Si-substrate and the GaAs layer (the first buffer layer), and thus the Si-substrate tends to be warped.

Furthermore, in order to prevent the adverse influence due to the propagation of crystal defect such as dislocation in the interface between the Si-substrate and its vicinity of the interface, the first and second buffer layers, particularly, the second buffer layer must be sufficiently thick. Therefore, the crystal growth process requires more than ten hours which limits the production volume of the semiconductor device. Moreover, since the thickness of the whole semiconductor device becomes large, heat dissipation through the substrate is decreased.

SUMMARY OF THE INVENTION

An object of the present invention is to provide a III-V compound semiconductor device formed on a Si-substrate which has minimum stress and no dislocation propagation.

According to the present invention, periodical recesses are formed on a surface of a Si-substrate. A GaAs strain superlattice layer is formed on the recesses such that a gallium layer and an arsenic layer cover one side surface and the other side surface of the recess of the silicon semiconductor substrate, respectively.

A method of making the semiconductor device, according to the present invention comprises the step of forming periodic recesses in a flat surface of a silicon semiconductor substrate, forming a GaAs strain superlattice layer by forming a monoatomic gallium layer or a monoatomic arsenic layer on the surface having the periodic recesses, irradiating one side surfaces of the recesses with a gallium beam and then irradiating the other side surfaces of the recesses with an arsenic beam to bury the recesses with a gallium layer and a arsenic layer and to form a continuous gallium layer or an arsenic layer on the surface and then forming alternate arsenic layers and gallium layers and forming a predetermined compound semiconductor layer thereon.

DETAILED DESCRIPTION OF THE PREFERRED EMBODIMENTS

Figure 2A:
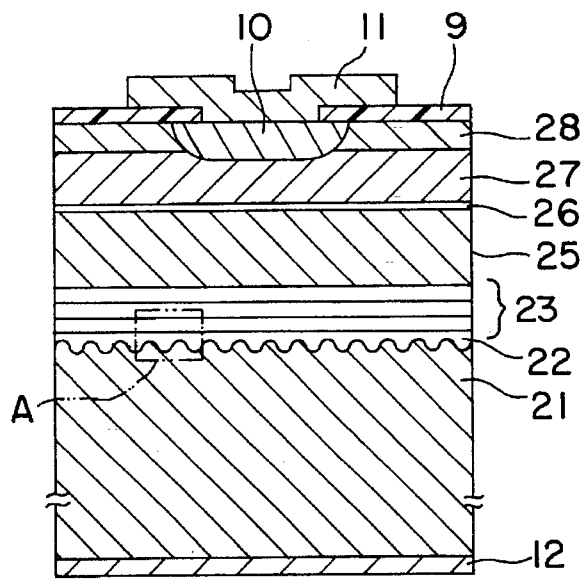
FIG. 2A is a cross sectional view of a laser diode according to an embodiment of the present invention.
Figure 2B:
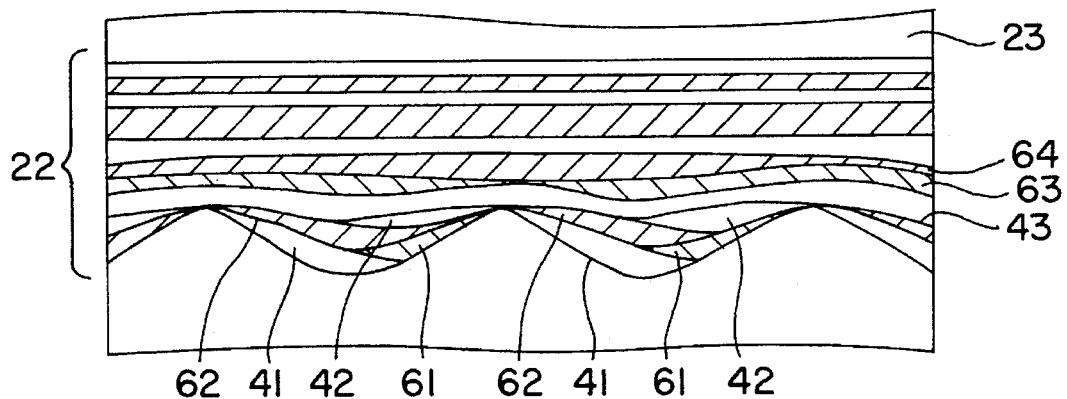
FIG. 2B is an enlarged cross sectional view of a portion A in FIG. 2A.

Referring to FIG. 2A and FIG. 2B, an n-type Si-substrate 21 has a top surface formed with periodic recesses each 10–50 nm deep and with a pitch of 100–200 nm. A GaAs strain superlattice layer 22 having thickness of 0.1–0.5 μm is grown on the surface of the Si-substrate 21. As shown in FIG. 2B, the GaAs strain superlattice layer 22 includes a gallium layer 41 and an arsenic layer 61 covering one and the other side surfaces of each recess of the n-type Si-substrate 21, respectively.

A compound semiconductor layer formed on the GaAs strain superlattice layer 22 is a continuous lamination of an InP-In$_x$Ga$_{1-x}$As$_y$P$_{1-y}$ strain superlattice layer 23 having thickness of 0.1–0.5 μm where 0<x<1 and 0<y<1, an n-type InP clad layer 25 having thickness of 2 μm, an In$_{0.75}$ Ga$_{0.24}$ As$_{0.55}$ P$_{0.45}$ active layer 26 having thickness of 0.1 μm, a p-type InP clad layer 27 having thickness of 1–2 μm and an n-type In$_t$ Ga$_{1-t}$ As$_u$ P$_{1-u}$ contact layer 28 having thickness of 1–5 μm. Instead of InP, the clad layers may be formed of $In_u Ga_{1-u} As_w P_{1-w}$ whose band gap is larger than that of the active layer.

Figure 1:
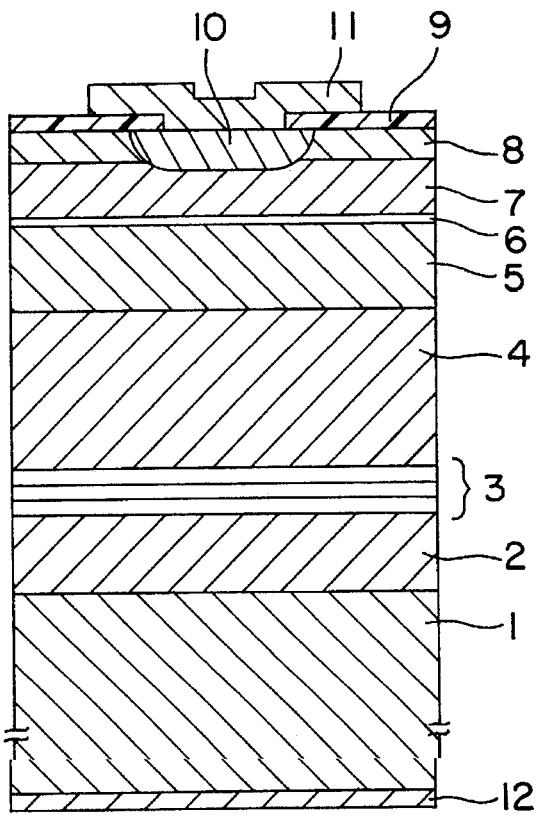
FIG. 1 is a cross sectional view of a conventional laser diode.

The GaAs strain superlattice layer 22 has a function to make a flat surface as a buffer layer between the Si-substrate 21 and the compound semiconductor layers 23, 25–28 for preventing upward propagation of dislocation due to anti-phased domain, thereby to reduce crystal defects in the upper layers. This is because the possibility of a dislocation propagating in a thickness direction of the substrate can be minimized and the dislocation can be concentrated in the recesses due to the fact that, during formation of the GaAs strain superlattice layers on the recesses, the surface of the Si-substrate is flattened by burying the recesses with the gallium layers and the arsenic layers while alternately covering the side surfaces of each recess with these layers. Although the strain superlattice layer 22 corresponds to the first buffer layer of the conventional device, its thickness is smaller than that of the first buffer layer. Furthermore, since the cladding layers can be formed directly on the InP-In$_x$ Ga$_{1-x}$ As$_y$ P$_{1-y}$ strain superlattice layer 23 without using the conventional second buffer layer 4 shown in FIG. 1, the thickness of the buffer layer can be reduced. As the surface area of the Si-substrate having recesses is larger than that of a substrate having a flat surface, stress can be reduced correspondingly and possibility of warping is substantially reduced.

Figure 3:
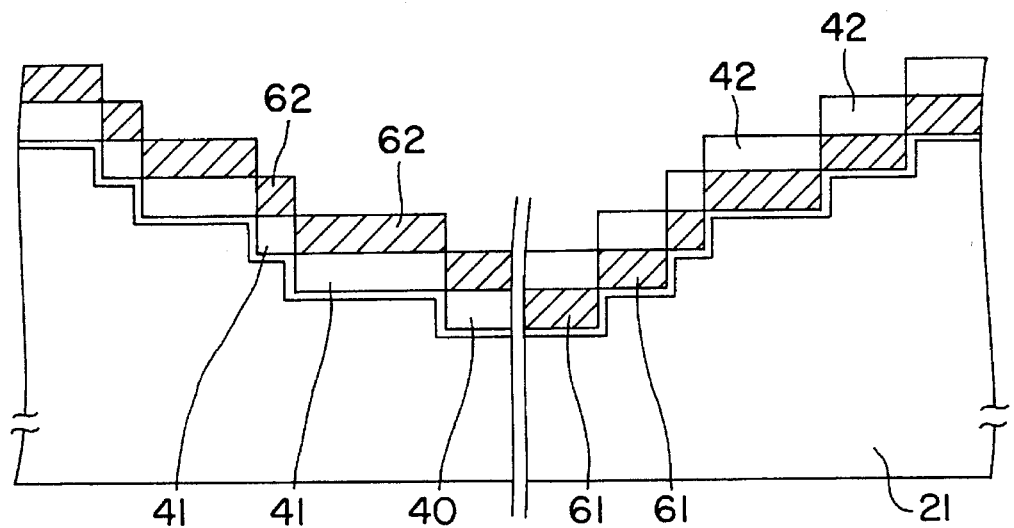
FIG. 3 is a cross sectional view for explaining a growth method according to an embodiment of the present invention.

Referring to FIG. 3, a method for making a laser diode will be described. Recesses that are each 10–50 nm in depth are formed on a surface ((100) plane) of an n-type Si-substrate 21 with a pitch of 100–200 nm by using, for example, interference exposure which is used for formation of a diffraction grating in a distributed feedback type laser diode. The interference exposure uses, for example, a He-Cd laser having wavelength of 325 nm as a light source to produce interference fringes with which a resist film is exposed and can produce a diffraction grating having a period not smaller than a half of the light source wavelength.

Each recess formed in this way is extended in the direction perpendicular to the drawing sheet and has a stepped cross section as shown in FIG. 3.

Thereafter, a Ga monoatomic layer 40 is formed by using atomic layer epitaxy (ALE), with the temperature of the Si-substrate 11 being maintained at 550°–650° C. As mentioned in the above description of the related art, the purpose of the monoatomic Ga layer is to prevent anti-phased domains from occurring. It is of course possible to form an As monoatomic layer instead of the Ga layer. Then, on the steps on the left side in FIG. 3, Ga layers 41 are grown to 2–5 nm by directing a Ga beam obliquely thereto from a Ga beam source arranged in an upper right portion in FIG. 3 by using ALE or MBE. Thereafter, As layers 61 are similarly grown on the right side steps to depths of 2–5 nm. These processes are repeated alternately to form As layers 62 on the Ga layers 41, Ga layers 42 on the As layers 61, Ga layers 43 on the As layers 62, and so on. Thus, on the Ga monoatomic layers 40, 41 on each left side step, the As layer 62, the Ga layer 43, the As layer 64, . . . are laminated and, on the As layer 61 on each right side step, the Ga layer 42, the As layer 63, the Ga layer 44, . . . are laminated. During this laminating process, diffusion of Ga atom or As atom occurs and the recess is gradually buried and flattened. By repeating the alternate supply of Ga and As several to several tens of times, a GaAs strain superlattice layer 22 having flat surface is formed. Dislocation occurring during the formation of the GaAs strain superlattice layer 22 may tend to propagate from the left and right side surfaces of the recess to a center portion of the recess and concentrate therein. Since it is possible to define the upward propagation of the dislocation due to anti-phased domains within the recess in this manner, it is possible not only to reduce the thickness of the buffer layer, that is, the GaAs strain superlattice layer 22, to 0.1–0.5 μm but also to dispense with the conventional second buffer layer 4, when compared with the conventional technique in which the GaAs buffer layer 2 is formed on the flat Si-substrate 1. Therefore, it is possible to reduce the crystal growing time for formation of the buffer layer to two to three hours.

As will be clear from the foregoing, the depth and pitch, that is, period, of the recesses may be larger than the lattice constant of GaAs crystal and smaller than a half of the diffusion length of Ga and As at growing temperature, respectively.

Then, an InP-In$_x$ Ga$_{1-x}$ As$_y$ P$_{1-y}$ strain superlattice layer 23 is formed by using metal organic chemical vapor deposition (MOCVD). In this case, even if the surface of the GaAs strain superlattice layer 22 is insufficiently flat, the surface of the InP-In$_x$ Ga$_{1-x}$ As$_y$ P$_{1-y}$ strain superlattice layer 23 becomes sufficiently flat. Since the formation of the layers 25–28 is performed in the same manner as that of the conventional or usual laser diode, details thereof are omitted in this description.

Since the laser diode itself according to this embodiment can be used with the p-side electrode 11 being mounted on a heat sink, the thickness of the buffer layer has almost no influence on heat dissipation. However, for an optical integrated circuit where the n-side electrode 12 is mounted on the heat sink, the thickness of the buffer layer influences heat dissipation considerably.

Although the present invention has been described for the case where the compound semiconductor layer is of InP-In$_q$ Ga$_{1-q}$ As$_r$ P$_{1-r}$, the present invention can be applied generally to III-V compound semiconductor layers. For example, for the GaAs layer, it is enough to form the GaAs layer directly on the GaAs strain superlattice layer 22 and, for an Al$_p$ Ga$_{1-p}$ As layer, it is enough to form a GaAs-Al$_p$ Ga$_{1-p}$ As strain superlattice layer on the GaAs strain superlattice layer 22 and form the Al$_s$ Ga$_{1-s}$ As layer on the GaAs-Al$_p$ Ga$_{1-p}$ As strain superlattice layer.

Furthermore, stress due to differences in thermal expansion coefficients is reduced by the recesses. Therefore, the possibility of warping of the substrate is reduced, the reliability of the semiconductor device is improved and it is possible to increase an area of the substrate in which semiconductor devices can be formed.

As is described above, the present invention includes, as the buffer layer, the Si-substrate having recesses formed on its surface and the GaAs strain superlattice layer including the gallium layers and the arsenic layers covering on one side surface and the other side surface of each recess. Therefore, in addition to the above mentioned advantages, when the present invention is applied to form an integrated circuit, a further advantage arises in that thermal resistance is reduced and heat dissipation is improved.

I claim:

1. A III-V compound semiconductor device comprising: a silicon substrate having a surface formed with periodic recesses; a GaAs strain superlattice layer formed on said recesses, said GaAs strain superlattice layer including gallium layers and arsenic layers covering one side surface and the other side surface of each of said recesses; and a III-V compound semiconductor layer formed on said GaAs strain superlattice layer.

2. A III-V compound semiconductor device as set forth in claim 1, wherein said GaAs strain superlattice layer is covered with as $In_xGa_{1-x}As_yP_{1-y}$-InP strain superlattice layer (0<x<1, 0<y<1) and an InP layer is formed thereon.

3. A III-V compound semiconductor device formed on a silicon substrate comprising:

a silicon monocrystalline semiconductor substrate having a surface comprising periodic recesses elongated in one direction;

a GaAs strain superlattice layer formed on said recesses, said GaAs strain superlattice layer having a plurality of monoatomic layers of gallium and arsenic such that a first gallium layer is formed on one side surface of each said recesses, a first arsenic layer is formed on another side surface of each said recesses, a second arsenic layer is formed on said first gallium layer and said first arsenic layer, a second gallium layer formed on said second arsenic layer, and a third gallium layer is formed on said second gallium layer and said second arsenic layer; and III-V compound semiconductor layers formed on said GaAs strain superlattice layer.

4. A III-V compound semiconductor device as set forth in claim 3, wherein said III-V compound semiconductor layers include another strain superlattice layer of InP-InGaAsP formed on said GaAs strain superlattice layer.

5. A III-V compound semiconductor device as set forth in claim 4, wherein said III-V compound semiconductor layers further include a first InP clad layer formed on said strain superlattice layer of InP-InGaAsP, an InGaAsP active layer, and a second InP clad layer formed on said active layer so as to form a laser diode.

* * * * *